United States Patent [19]

Park

[11] Patent Number: 5,479,122
[45] Date of Patent: Dec. 26, 1995

[54] SYNC SIGNAL DETECTION APPARATUS

[75] Inventor: Shi-hong Park, Bucheon, Rep. of Korea

[73] Assignee: Samsung Electronics Co., Ltd., Suwon, Rep. of Korea

[21] Appl. No.: 164,856

[22] Filed: Dec. 10, 1993

[30] Foreign Application Priority Data

Dec. 14, 1992 [KR] Rep. of Korea .................. 1992-24126

[51] Int. Cl.[6] ...................................... H03K 3/00
[52] U.S. Cl. .................. 327/99; 327/387; 327/41; 327/18
[58] Field of Search ................... 327/41, 18, 99, 327/387, 44, 46, 20; 323/315

[56] References Cited

U.S. PATENT DOCUMENTS 3,956,685  5/1976  Gordon ..................... 321/60
4,510,612  4/1985  Scholten et al. ............ 375/106
4,740,687  4/1988  Kiyohara .................... 250/214 R
4,982,116  1/1991  Lee .......................... 327/99
5,227,672  7/1993  Sawtell ..................... 327/99

Primary Examiner—Timothy P. Callahan
Assistant Examiner—Eunja Shin
Attorney, Agent, or Firm—Cushman Darby & Cushman

[57] ABSTRACT

A device detecting a sync signal is provided, which comprises a sync signal detector having an output selector, an internal clock generator and a combination of three current mirror circuits formed of MOS transistors, and two MOS transistors having resistance characteristics. Irrespective of the high and low state of the input clock signal, the selecting signal for selecting the received sync signal, is made to be high, and the discharge time of the capacitor is minimized so that a capacitor having small capacity can be used and the volume of an integrated circuit element can be minimized and the stable operation is performed, irrespective of the frequency band of the sync signal and the duty thereof.

9 Claims, 2 Drawing Sheets

SYNC SIGNAL DETECTION APPARATUS

BACKGROUND OF THE INVENTION

The present invention relates to a sync signal detection apparatus, and more particularly, to a sync signal detection apparatus wherein a circuit formed of the combination of plural MOS transistors is installed and consequently a discharge time of a capacitor is minimized, so that the volume of an integrated circuit element is reduced and a stable operation is performed, irrespective of the frequency bandwidth of an input signal and the duty thereof.

The sync signal detection apparatus is widely used in a switching mode power supply (SMPS) control integrated circuit, a servo integrated circuit and so on, As illustrated in FIG. 1, the conventional sync signal detection apparatus includes an external signal input terminal 11 for receiving an external sync signal, a power input terminal 12, a signal output terminal 13, a first inverter INV1 for inverting the sync signal, an NMOS transistor M11 for making the input of first inverter INV1 a low state when no signal is received in external signal input terminal 11, a PMOS transistor M21 whose operation is performed depending on the output of first inverter INV1, a capacitor C for charging and discharging the power provided by PMOS transistor M21, an RC time constant setting resistance R for setting an RC time constant, a second inverter INV2 for inverting the signal provided by capacitor C, first through third NAND gates NAND1, NAND2 and NAND3 for selectively outputting a signal, and a clock generator 14 for forming an internal signal.

Referring to FIG. 1, the conventional sync signal detection apparatus of the above structure is explained in more detail.

When no input is received in external signal input terminal 11, an input of first inverter INV1 is made a low state by NMOS transistor M11. As a result, if a high signal is applied to the gate of PMOS transistor M21 connected to the output of first inverter INV1. PMOS transistor M21 turns off. Accordingly, the input to second inverter INV2 goes low.

As a result, the output of second inverter INV2 is made high by input power VDD so as to be applied to one terminal of second NAND gate NAND2 and the output of the internal clock generator 14 connected to the other terminal of second NAND gate NAND2 passes through second NAND gate NAND2.

On the other hand, while a low signal is applied to one terminal of first NAND gate NAND1 connected to external signal input terminal 11, a low signal is applied to the other terminal of first NAND gate NAND1 by the output of PMOS transistor M21, so that a high signal is applied to one terminal of third NAND gate NAND3 connected to the output of first NAND gate NAND1. Accordingly, the signal of internal clock generator 14 is input to the other terminal or third NAND gate NAND3 to be output through signal output terminal 13.

When a sync signal is received in external signal input terminal 11, the received sync signal is applied in the input of first inverter INV1 according to the resistance characteristics of NMOS transistor M11. Then, when the inverted input signal is applied to the gate of PMOS transistor M21 connected to the output of first inverter INV1, PMOS transistor M21 performs turning-on and turning-off operations, so that input voltage VDD received in power input terminal 12 is provided to capacitor C. Thus, capacitor C is charged when PMOS transistor M21 performs the turn-on function, and the capacitor is discharged according to the RC time constant when the PMOS transistor M21 turns off.

Here, the output of PMOS transistor M21 having a frequency within a utilization frequency band is charged in capacitor C, to then be discharged according to the RC time constant. In this case, when the RC combination can be selected in order that the discharged output is maintained in a high state, a high signal is applied to the input of second inverter INV2 connected to the output of capacitor C and a low signal is applied to one terminal of the input of second NAND gate NAND2, so that the output of internal clock generator 14 connected to the other terminal of second NAND gate NAND2 is not output through second NAND gate NAND2, but the output of second NAND gate NAND2 is maintained in a high state.

On the other hand, the received sync signal is applied to one terminal of the input of first NAND gate NAND1 connected to external signal input terminal 11 and a high signal by the output of capacitor C is applied to the other terminal of the first NAND gate NAND1. As a result, the externally received sync signal is applied to one terminal of third NAND gate NAND3 connected to the output of first NAND gate NAND1, and a high signal is applied to the other terminal of third NAND gate NAND3 connected to the output of second NAND gate NAND2. Accordingly, the externally received sync signal is produced through output terminal 13 by means of the applied high signal. In such a manner, the external sync signal and the internally generated clock signal can be selectively produced.

According to the above description, the conventional sync signal detection apparatus has a problem in that when the operating frequency region of an input signal is expanded or the duty of the input signal is decreased, resistor R, capacitor C and PMOS transistor M21 each of which have a large capacity should be used. Therefore, the utilization frequency band is limited and the size of an integrated circuit element is increased.

SUMMARY OF THE INVENTION

To solve the problem, an object of the present invention is to provide a sync signal detection apparatus, including a circuit of the combination of three current mirror circuits which are formed of predetermined MOS transistors, and two MOS transistors having resistance characteristics, wherein the volume of the integrated circuit element can be minimized, and, independent of the frequency band of the sync signal and the duty thereof, stable operation is performed.

To achieve the object, a sync signal detecting device according to the present invention, comprises:

output selector means wherein if an external sync signal is received, the external sync signal is selected as the clock signal and otherwise, an internal clock signal is selected as the clock signal.

an internal clock generator for generating the internal clock signal, and sync signal detector means which includes a first constant-current circuit for generating a first current signal in response to the low period of the external sync signal, a second constant-current circuit for generating a second current signal in response to the high period of the external sync signal, and a charge/discharge circuit for charging according to the first and the second current signal and discharging when there are no first and the second current signals, thereby generating a control signal for selectively outputting the external sync signal and the internal clock signal from the output selector means by detecting whether or not the external sync signal is received therein.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Hereinafter, an embodiment of the sync signal detection apparatus according to the present invention will be described with reference to the attached drawings in more detail.

Figure 1:
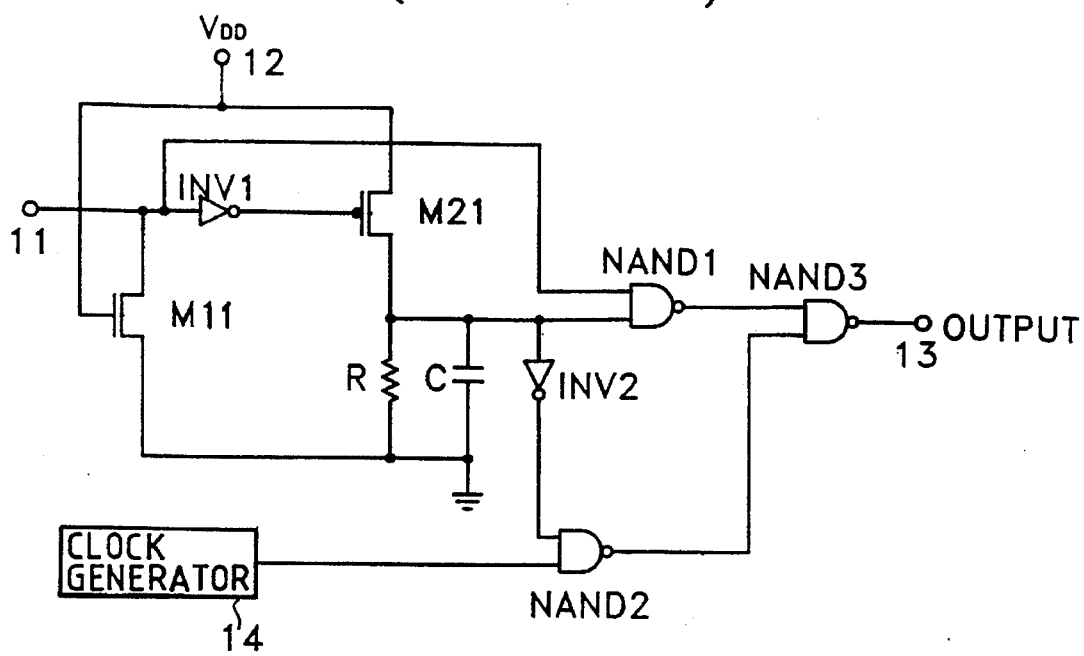
FIG. 1 is a circuit diagram of the conventional sync signal detection apparatus.
Figure 2:
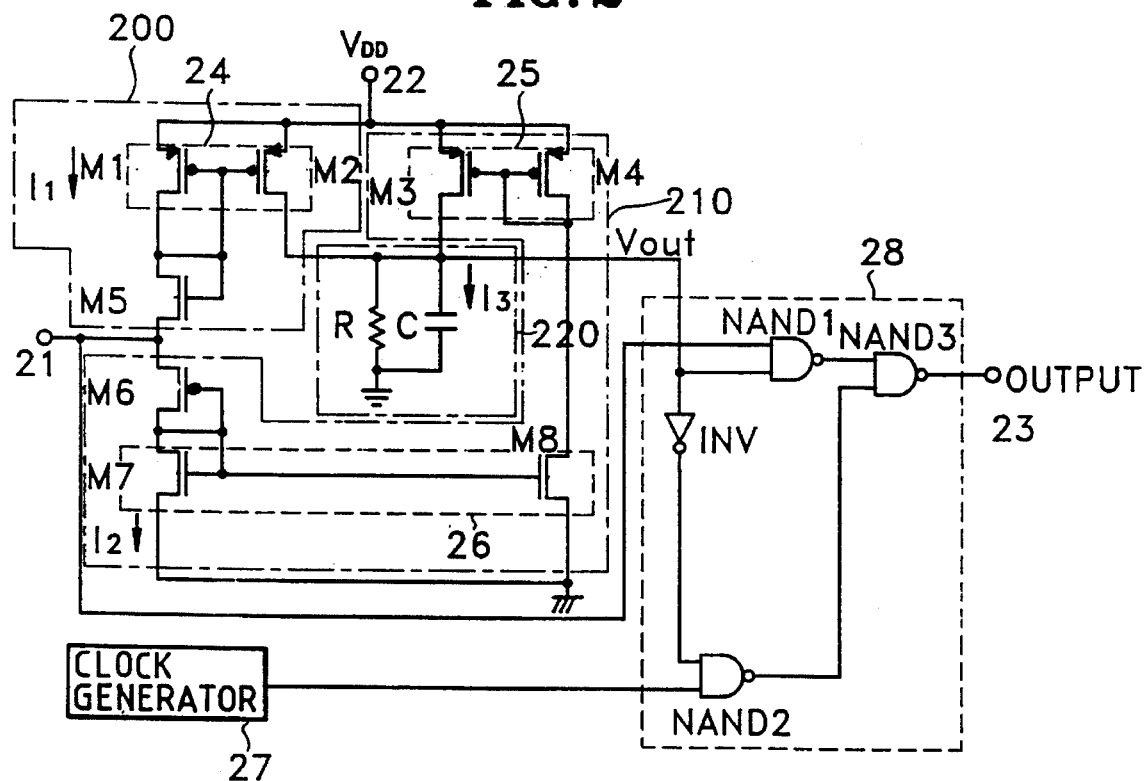
FIG. 2 is a circuit diagram of a sync signal detection apparatus according to the present invention.

FIG. 2 is a detailed circuit diagram of one embodiment of the sync signal detection apparatus according to the present invention.

Referring to FIG. 2, first constant-current circuit 200 includes a first current mirror 24 which is connected to power voltage VDD to mirror the current, and a first resistance means which is connected between first current mirror 24 and input terminal 21. First mirror 24 includes a first PMOS transistor M1 having a source electrode connected to power voltage VDD and a drain electrode connected commonly to a gate electrode, a second PMOS transistor M2 having a source electrode connected to power voltage VDD and a gate electrode connected to the gate electrode of first PMOS transistor M1 so as to mirror the current of first PMOS transistor M1. The first resistance means includes a third NMOS transistor M5 having a drain electrode connected to the drain electrode of first PMOS transistor M1 of first current mirror 24 and a source electrode connected to the external sync signal input terminal 21.

Second constant-current circuit 210 includes second current mirror 25 which is connected to power voltage VDD to mirror the current, the second resistance means connected in series to the first resistance means, and third current mirror 26 which is connected to the second resistance means and between second current mirror 25 and ground potential, so as to mirror the current.

Second current mirror 25 includes a fourth PMOS transistor M4 having a source electrode connected to power voltage VDD and a drain electrode connected commonly to a gate electrode, and a third PMOS transistor M3 which has a source electrode connected to the power voltage VDD and a gate electrode connected to the gate electrode of fourth PMOS transistor M4 so as to mirror the current of fourth PMOS transistor M4.

The second resistance means is connected to the source electrode of third NMOS transistor M5 which forms first resistance means $R_1$, and includes a fifth PMOS transistor M6 having a source electrode for receiving an external sync signal and a drain electrode connected to the drain electrode of first NMOS transistor M7 of third current mirror 26 and to the gate electrode thereof.

Third current mirror 26 includes a first NMOS transistor M7 having a source electrode connected to ground potential and a drain electrode connected commonly to a gate electrode, and a second NMOS transistor M8 which has a drain electrode connected to the drain electrode of fourth PMOS transistor M4 of second current mirror 25, a source electrode connected to ground, and a gate electrode connected to the gate electrode of first NMOS transistor M7 so as to mirror the current of first NMOS transistor M7.

Also, charge/discharge means 220 includes a capacitor C for charging or discharging the voltage provided by first and second current mirror 24 and 25, and an RC time constant setting resistance R for setting an RC time constant.

Hereinafter, according to the present invention, an operation of the sync signal detection apparatus having the above structure is explained in more detail with reference to the attached drawings.

When no input is received in external signal input terminal 21, a voltage VDD/4 is applied respectively to serially connected MOS transistors M1, M5, M6 and M7, by input voltage VDD. Then, the applied voltage creates a biasing potential which is less than the threshold voltages of MOS transistors M1, M5, M6 and M7, so that a current I1 illustrated in FIG. 2 becomes a minute value. Thus, the input voltage applied to the MOS transistors between the input voltage of the sync signal input terminal and ground potential is rendered less than the threshold voltage, and MOS transistors M5 and M6 constituting the first and second resistance means can be composed of plural transistors, diodes or resistors.

According to the operation of third current mirror 26, the current flowing via second NMOS transistor M8 equals that flowing via first NMOS transistor M7. In this case, the current of the first NMOS transistor M7 is the same as that flowing via fourth PMOS transistor M4 of second current mirror 25. Also, the current flowing via third PMOS transistor M3 is the same as current I1, that is, the current flowing through first NMOS transistor M7.

Also, since the current flowing via first PMOS transistor M1 of first current mirror 24 equals that flowing via first NMOS transistor M7 of third current mirror 26, the current flowing via second PMOS transistor M2 of first current mirror 24 equals current I1.

The mixed current produced in second PMOS transistor M2 and third PMOS transistor M3 and supplied to capacitor C corresponds to 2I1. Here, mixed current 2I1 is made to be less than 1 µA by circuit design and an output voltage VOUT generating a signal for selecting the input sync signal is made to be less than 0.1 V.

As a result, while a low signal is applied to inverter INV and to one input terminal of first NAND gate NAND1, the output of inverter INV becomes high, and the signal is applied to one terminal of second NAND gate NAND2, so that the output of internal clock generator 27 is supplied to the other terminal of third NAND gate NAND3 via second NAND gate NAND2.

On the other hand, while a low signal is applied to one terminal of first NAND gate NAND1 connected to external signal input terminal 21, a high signal is applied to one terminal of third NAND gate NAND3 connected to the output of first NAND gate NAND1. As a result, the signal of internal clock generator 27 is received by the other gate of third NAND gate NAND3 so as to be produced through output terminal 23.

Herein, the operation when sync clock signal is received in external signal input terminal 21 is described according to each logic case, that is, when the clock is high or low and then falls or rises.

First of all, in the serially connected MOS transistors M5 and M6, the sync clock signal having voltage VDD in a high level and ground potential in a low level is received in the output of M5 and in the input of M6. If a high level of the sync clock signal is applied, then MOS transistors M1 and M5 are turned off by the voltage difference applied between MOS transistors M1 and M5, and serially connected MOS transistors M6 and M7 are made to be biased more than the threshold voltage by the voltage difference applied between MOS transistors M6 and M7, so that current I2 exponentially increases.

Accordingly, by the function of third current mirror 26, the current flowing via second NMOS transistor M8 equals current I2 which is the current of first NMOS transistor M7. In this case, current I2 of first NMOS transistor M7 is the same as that flowing through fourth PMOS transistor M4 of second current mirror 25. Also, by the function of second current mirror 25, the current flowing through third PMOS transistor M3 is the same as current I2.

As a result, voltage VOUT produced via fourth PMOS transistor M4 becomes high and current I2 is charged in capacitor C.

When a low level of the sync clock signal is applied to the connection terminal of MOS transistors M5 and M6, no voltage is applied between MOS transistors M6 and M7. Accordingly, MOS transistors M6 and M7 turn off. Also, MOS transistors M1 and M5 are biased more than the threshold voltage by the difference voltage applied between serially connected transistors M1 and M5, so that current I1 exponentially increases.

As a result, according to the function of first current mirror 24, output voltage VOUT of second PMOS transistor M2 is high, and the current which amounts to current I1 is charged in capacitor C.

Figure 3:
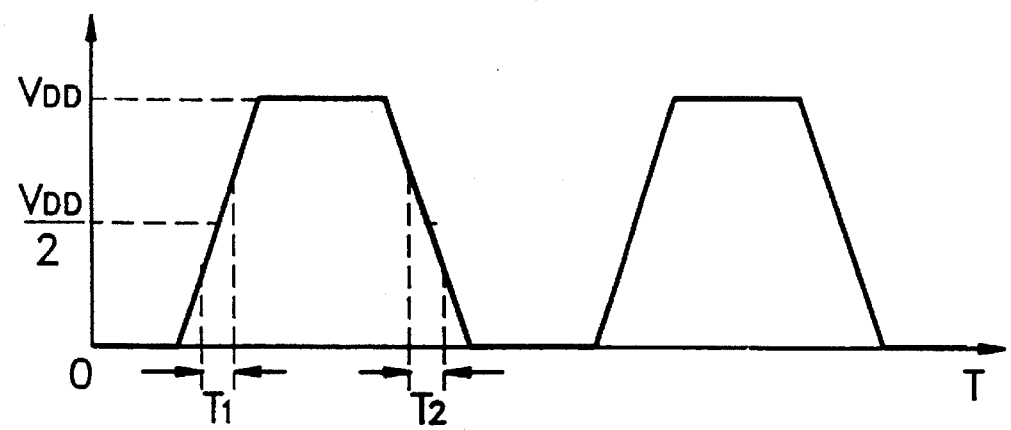
FIG. 3 is a view showing the relationship between the clock signal of the sync signal detection apparatus and the discharge time of a capacitor according to the present invention.

When the sync clock received in the connection terminal between MOS transistor M5 and M6 ascends or descends, a relationship between the time and the voltage is illustrated in FIG. 3, wherein the voltage increases and decreases respectively according to the rise and fall of the clock signal. Accordingly, voltage VDD/2 is received in the connection terminal between M5 and M6 during time T1 and T2 wherein each voltage amounts to VDD/2, so that according to the same operation as that when no input is received in external input terminal 21, voltage VOUT becomes low.

Figure 4:
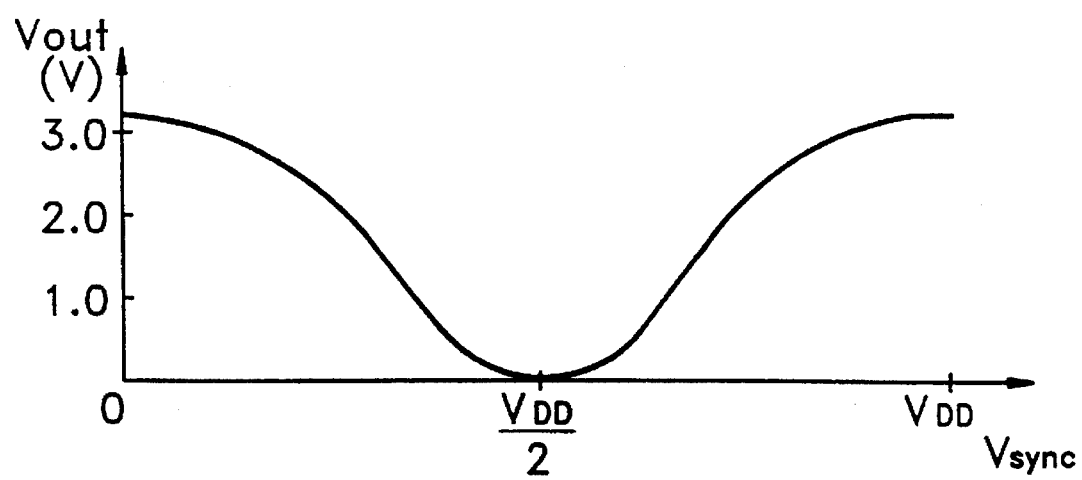
FIG. 4 is a waveform diagram of output VOUT depending upon the sync voltage of the sync signal detection apparatus according to the present invention.

Referring to FIG. 4 representing a relationship between voltages VOUT and Vsync, when Vsync is equal to zero, VOUT becomes a high state. Then, as Vsync increases, VOUT becomes a low state in the VDD/2 section. Then, as the voltage of Vsync increases, VOUT becomes high.

Thus, in the sync signal detection apparatus according to the present invention, the output of VOUT is formed as a high state in all sections except the very short section where the voltage varying according to the rise and fall of the clock signal ascends and descends reaches the VDD/2 section. The signal in the high state is applied to the input of inverter INV.

A low signal is applied to one terminal in the input terminal of second NAND gate NAND2 by means of the operation of inverter INV so that the signal of internal clock generator 27 connected to the other terminal of second NAND gate NAND2 is not output through second NAND gate NAND2, and the output of second NAND gate NAND2 is maintained in a high state.

On the other hand, if the external sync signal is applied to one terminal in the inputs of first NAND gate NAND1 and a high signal depending on the output of capacitor C is applied to the other terminal of first NAND gate NAND1, the external sync signal is applied to one terminal of third NAND gate NAND3 connected to the output of first NAND gale NAND1. According to the high signal applied to the other terminal of third NAND gate NAND3 connected to the output in second NAND gate NAND2, the external sync signal is produced through output terminal 23. In such a manner, either the external sync signal or the internal sync signal is selected to be produced.

As described above, the sync signal detection apparatus according to the present invention is formed of the combination of the MOS transistors, so that voltage VOUT is made to be in the high state independent of the high and low state of the clock signal. Also, the discharge time of capacitor C is minimized so that a capacitor having small capacity can be used therein and the volume of an integrated circuit element can be minimized. Further, the permissible frequency range of the sync signal is broadly expanded and stable operation is performed therein, irrespective of the duty of the clock signal.

What is claimed is:

1. A sync signal detection apparatus comprising:

output selector means responsive to a control signal for producing an external sync signal as a clock signal, and otherwise producing an internal clock signal as said clock signal;

an internal clock generator for producing said internal clock signal; and, sync signal detection means including a first constant-current circuit for generating a first current signal in response to a low amplitude half-cycle of said external sync signal, a second constant-current circuit for generating a second current signal in response to a high amplitude half-cycle of said external sync signal, and a charge/discharge circuit for charging and producing said control signal in response to said first and second current signals, and discharging in response to absence of said external sync signal.

2. A sync signal detection apparatus as claimed in claim 1, wherein said first constant-current circuit comprises:

a first current mirror connected to a power voltage; and, first resistance means connected between said first current mirror and an input terminal which receives said external sync signal.

3. A sync signal detection apparatus as claimed in claim 2, wherein said first current mirror comprises a first PMOS transistor having a source electrode connected to said power voltage, a gate electrode, and a drain electrode connected to said gate electrode, and a second PMOS transistor having a source electrode connected to said power voltage and a gate electrode connected to said gate electrode of said first PMOS transistor so as to mirror a current through said first PMOS transistor.

4. A sync signal detection apparatus as claimed in claim 3, wherein said first resistance means comprises a third NMOS transistor having a drain electrode connected to said drain electrode of said first PMOS transistor of said first current mirror and a source electrode connected to said input terminal.

5. A sync signal detection apparatus as claimed in claim 4, wherein said second constant-current circuit comprises:
   a second current mirror connected to said power voltage;
   second resistance means connected serially to said first resistance means; and,
   a third current mirror connected to said second resistance means and between said second current mirror and ground potential.

6. A sync signal detection apparatus as claimed in claim 5, wherein said second current mirror comprises a fourth PMOS transistor having a source electrode connected to said power voltage, a gate electrode, and a drain electrode connected to said gate electrode, and a third PMOS transistor having a source electrode connected to said power voltage and a gate electrode connected to said gate electrode of said fourth PMOS transistor so as to mirror a current through said fourth PMOS transistor.

7. A sync signal detection apparatus as claimed in claim 6, wherein said second resistance means is connected to said source electrode of said third NMOS transistor of said first resistance means, and includes a fifth PMOS transistor having a source electrode coupled to said input terminal, a gate electrode, and a drain electrode connected to said third current mirror.

8. A sync signal detection apparatus as claimed in claim 7, wherein said third current mirror comprises a first NMOS transistor having a source electrode connected to said ground potential, a gate electrode, and a drain electrode connected to said gate electrode and to said drain electrode of said fifth PMOS transistor of said second resistance means, and a second NMOS transistor having a drain electrode connected to said drain electrode of said fourth PMOS transistor of said second current mirror, a source electrode connected to said ground potential, and a gate electrode connected to said gate electrode of said first NMOS transistor, so as to mirror a current through said first NMOS transistor.

9. A sync signal detection apparatus as claimed in claim 1, wherein said charge/discharge circuit includes a charging/discharging resistor, and a capacitor connected in parallel to said resistor.

* * * * *